United States Patent
Baars et al.

(10) Patent No.: US 8,293,605 B2
(45) Date of Patent: Oct. 23, 2012

(54) METHODS FOR FABRICATING A CMOS INTEGRATED CIRCUIT HAVING A DUAL STRESS LAYER (DSL)

(75) Inventors: Peter Baars, Dresden (DE); Marco Lepper, Dresden (DE); Clemens Fitz, Dresden (DE)

(73) Assignee: GLOBALFOUNDRIES, Inc., Grand Cayman (KY)

( * ) Notice: Subject to any disclaimer, the term of this patent is extended or adjusted under 35 U.S.C. 154(b) by 0 days.

(21) Appl. No.: 13/034,902

(22) Filed: Feb. 25, 2011

(65) Prior Publication Data

US 2012/0220086 A1 Aug. 30, 2012

(51) Int. Cl.
*H01L 21/8234* (2006.01)

(52) U.S. Cl. .......... 438/275; 438/199; 257/E21.431

(58) Field of Classification Search .......... 257/E21.4, 257/E21.471, E21.483, E21.497
See application file for complete search history.

(56) References Cited

U.S. PATENT DOCUMENTS

| | | | |
|---|---|---|---|
| 2007/0096195 A1* | 5/2007 | Hoentschel et al. | 257/315 |
| 2008/0124856 A1* | 5/2008 | Pidin et al. | 438/199 |
| 2009/0197376 A1* | 8/2009 | Kohno et al. | 438/197 |
| 2009/0289284 A1* | 11/2009 | Goh et al. | 257/288 |

* cited by examiner

*Primary Examiner* — Cheung Lee
(74) *Attorney, Agent, or Firm* — Ingrassia Fisher & Lorenz, P.C.

(57) ABSTRACT

Methods are provided for fabricating a CMOS integrated circuit having a dual stress layer without NiSi hole formation. One method includes depositing a tensile stress layer overlying a semiconductor substrate. A portion of the tensile stress layer is removed, leaving a remaining portion, before applying a curing radiation. A curing radiation is then applied to the remaining portion; and a compressive stress layer is deposited overlying the semiconductor substrate and the remaining portion.

14 Claims, 6 Drawing Sheets

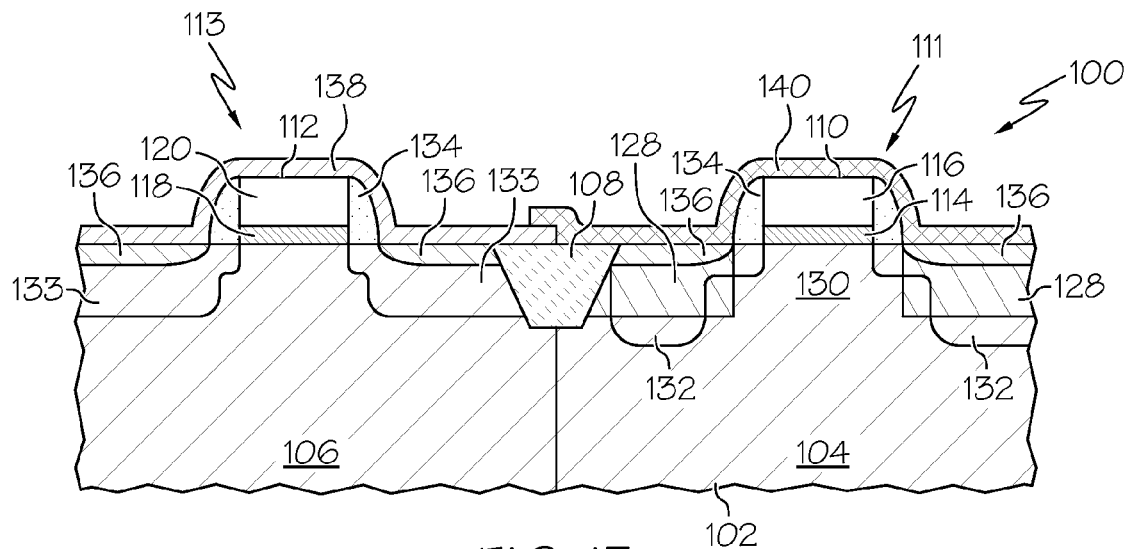
FIG. 13
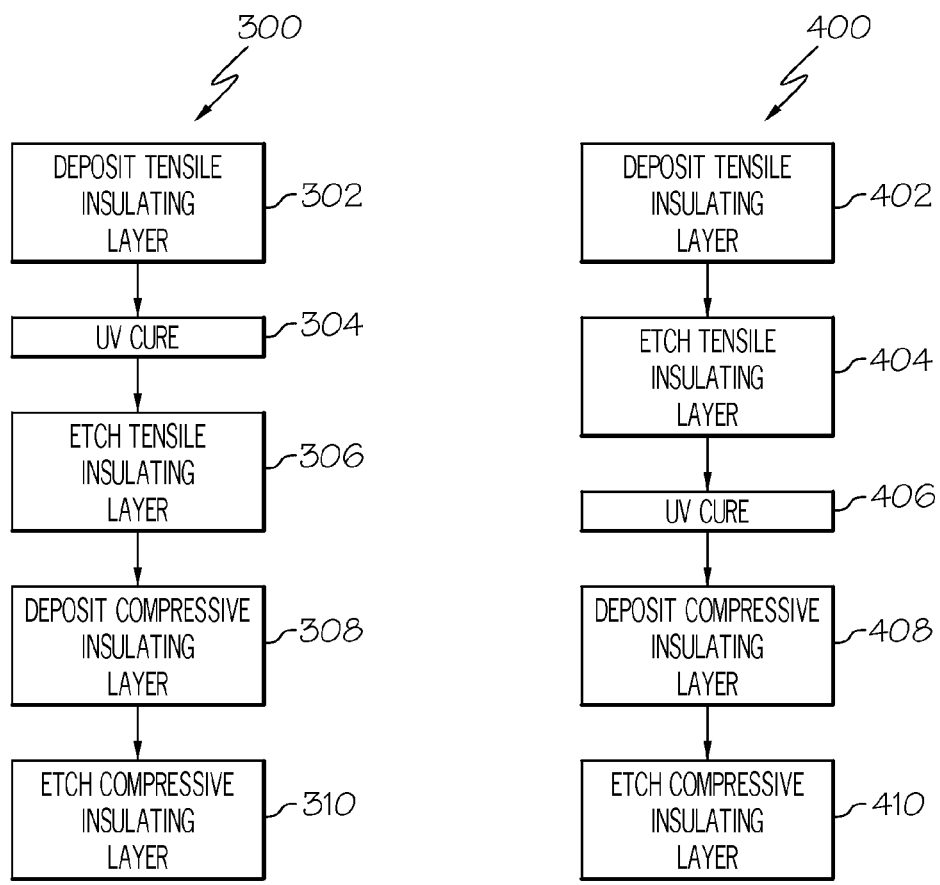
FIG. 14
FIG. 15

METHODS FOR FABRICATING A CMOS INTEGRATED CIRCUIT HAVING A DUAL STRESS LAYER (DSL)

TECHNICAL FIELD

The present invention generally relates to methods for fabricating CMOS integrated circuits, and more particularly relates to methods for fabricating CMOS integrated circuits having dual stress layers and metal silicide contacts.

BACKGROUND

The majority of present day integrated circuits (ICs) are implemented by using a plurality of interconnected field effect transistors (FETs) also called metal oxide semiconductor field effect transistors (MOSFETs), or simply MOS transistors. Indeed, most ICs are complementary MOS (CMOS) circuits that use both P channel MOS (PMOS) transistors and N channel (NMOS) transistors.

The trend in IC fabrication is to incorporate more and more circuitry on a single IC chip and to simultaneously improve the performance of the circuit. To achieve the performance goals, manufacturers have turned to techniques that apply strain to the individual transistors. Properly applied strain can be used to increase the mobility of majority carriers (holes for a PMOS transistor and electrons for an NMOS transistor) in the channel of the MOS transistors. One way to provide the proper strain is to form dual stress layers (DSL), sometimes also called "dual stress liners" overlying the transistors. Tensile stress layers are formed over NMOS transistors and compressive stress layers are formed over PMOS transistors. Further improvements in performance can be achieved by reducing time delays by reducing contact resistance, for example between source or drain regions and associated interconnect metallization. Contact resistance can be reduced by forming metal silicide contacts on the source and drain regions. Unfortunately the combination of dual stress layers and metal silicide contacts has led to a significant morphological degradation of the metal silicide which manifests itself as voids in the metal silicide. These voids can lead to significant yield reduction.

Accordingly, it is desirable to provide high yield methods for fabricating integrated circuits that incorporate dual stress layers. In addition, it is desirable to provide methods for fabricating CMOS integrated circuits that incorporate DSL and metal silicide contacts. Furthermore, other desirable features and characteristics of the present invention will become apparent from the subsequent detailed description and the appended claims, taken in conjunction with the accompanying drawings and the foregoing technical field and background.

BRIEF SUMMARY

Methods are provided for fabricating CMOS integrated circuits having dual stress layers without NiSi hole formation. In accordance with one embodiment a method for fabricating a CMOS integrated circuit includes forming both a PMOS region and an NMOS region in a semiconductor substrate and depositing a tensile insulating layer overlying the two regions. A portion of the tensile insulating layer overlying the PMOS region is removed, leaving a remaining portion of the tensile insulating layer overlying the NMOS region. After removing the portion of the tensile insulating layer the remaining portion is cured. A compressive insulating layer is then deposited overlying the PMOS region and the remaining portion that overlies the NMOS region. A portion of the compressive insulating layer overlying the remaining portion is then removed.

In accordance with another embodiment, a method for fabricating a CMOS integrated circuit includes forming a first gate structure overlying a PMOS region and a second gate structure overlying an NMOS region in a semiconductor substrate. An embedded SiGe region is epitaxially grown in a portion of the PMOS region in alignment with the first gate structure. P-type source and drain regions are formed in the embedded SiGe, N-type source and drain regions are formed in the NMOS region, and nickel silicide contacts are formed in those source and drain regions. A tensile nitride layer is deposited overlying the PMOS region and the NMOS region and a portion of the tensile nitride layer overlying the PMOS region is removed. Thereafter the tensile nitride layer is cured with ultraviolet radiation and a compressive nitride layer is deposited overlying the PMOS region.

In accordance with yet another embodiment, a method for fabricating a CMOS integrated circuit is provided that includes depositing a tensile stress layer overlying a semiconductor substrate. A portion of the tensile stress layer is removed and a remaining portion is left before applying a curing radiation. A curing radiation is applied to the remaining portion and a compressive stress layer is deposited overlying the semiconductor substrate and the remaining portion.

BRIEF DESCRIPTION OF THE DRAWINGS

The present invention will hereinafter be described in conjunction with the following drawing figures, wherein like numerals denote like elements, and wherein

FIGS. 1-5 and 10-13 illustrate, in cross section, methods for fabricating a CMOS integrated circuit in accordance with various embodiments of the present teaching;

FIG. 14 illustrates, in flow chart form, method steps in accordance with conventional processing for fabricating dual stress liners;

FIG. 15 illustrates, in flow chart form, method steps in accordance with the present teaching for fabricating dual stress liners on an integrated circuit;

DETAILED DESCRIPTION

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

FIGS. 1-9 illustrate schematically, in cross section, method steps used in the fabrication of a CMOS integrated circuit (IC) 100 in accordance with conventional processing methods. The discussion and illustration of conventional processing serves to disclose the problems attendant with such processing. Only two transistors, one NMOS 113 and one PMOS 111 are illustrated in the FIGURES although those of skill in the art will appreciate that a CMOS IC may include a large number of each type of device.

Various steps in the manufacture of MOS transistors are well known and so, in the interest of brevity, many conventional steps will only be mentioned briefly herein or will be omitted entirely without providing the well known process details. Although the term "MOS transistor" properly refers to a device having a metal gate electrode and an oxide gate insulator, that term will be used throughout to refer to any semiconductor device that includes a conductive gate electrode (whether metal or other conductive material) that is positioned over a gate insulator (whether oxide or other insulator) which, in turn, is positioned over a semiconductor substrate.

Figure 1:
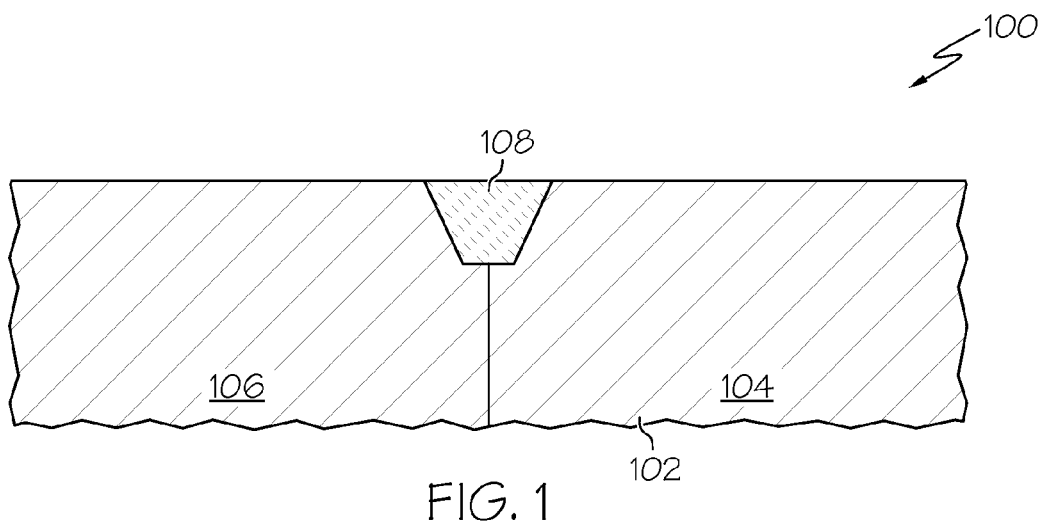
FIGS. 1-9 illustrate schematically, in cross section, method steps for fabricating a CMOS integrated circuit in accordance with conventional processing.

As illustrated in FIG. 1, fabrication of a CMOS integrated circuit 100 begins by providing a semiconductor substrate 102. The semiconductor substrate can be silicon, silicon admixed with germanium, or silicon admixed with other elements as is common in the semiconductor industry, and for convenience will hereinafter be referred to simply as either semiconductor or silicon. The substrate can be a bulk silicon wafer or a silicon on insulator (SOI) structure. A PMOS region 104 is formed in one portion of semiconductor substrate 102 and an NMOS region 106 is formed in another portion. The two regions may be separated by an electrical isolation structure such as, for example, a shallow trench isolation (STI) structure 108. The PMOS region is doped with N-type conductivity determining dopant impurities such as phosphorus or arsenic. The NMOS region is doped with P-type conductivity determining dopant impurities such as boron. The correct doping concentration and doping profile in each of the regions can be established, for example, by multiple ion implantations.

Figure 2:
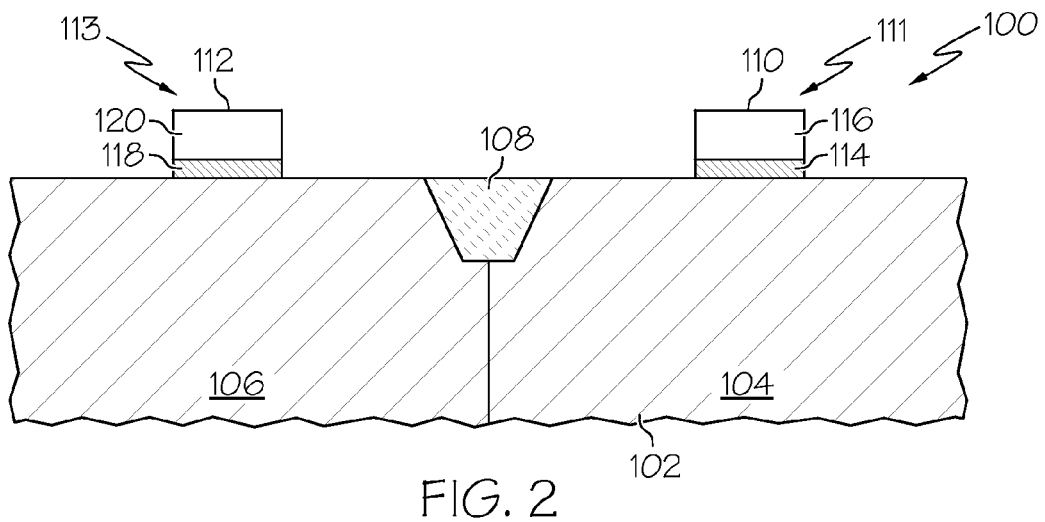

The fabrication of CMOS IC 100 continues as illustrated in FIG. 2 by forming a gate electrode structure 110 of a PMOS transistor 111 overlying PMOS region 104 and a gate electrode structure 112 of an NMOS transistor 113 overlying NMOS region 106. Gate electrode structure 110 includes a gate insulator 114 and a conductive gate electrode 116. Gate electrode structure 112 includes a gate insulator 118 and a conductive gate electrode 120. Gate insulators 114 and 118 can be silicon dioxide, high dielectric constant insulator, other insulating material, or combinations thereof selected in accordance with the integrated circuit function being implemented. Gate insulators 114 and 118 can be, but need not necessarily be, the same material. Conductive gate electrodes 116 and 120 can be polycrystalline or amorphous silicon, metal, other conductive material, or combinations thereof. Again, the materials selected for the conductive gate electrodes can be selected in accordance with the integrated circuit function being implemented. The two conductive gate electrodes can be the same or different materials.

Figure 3:
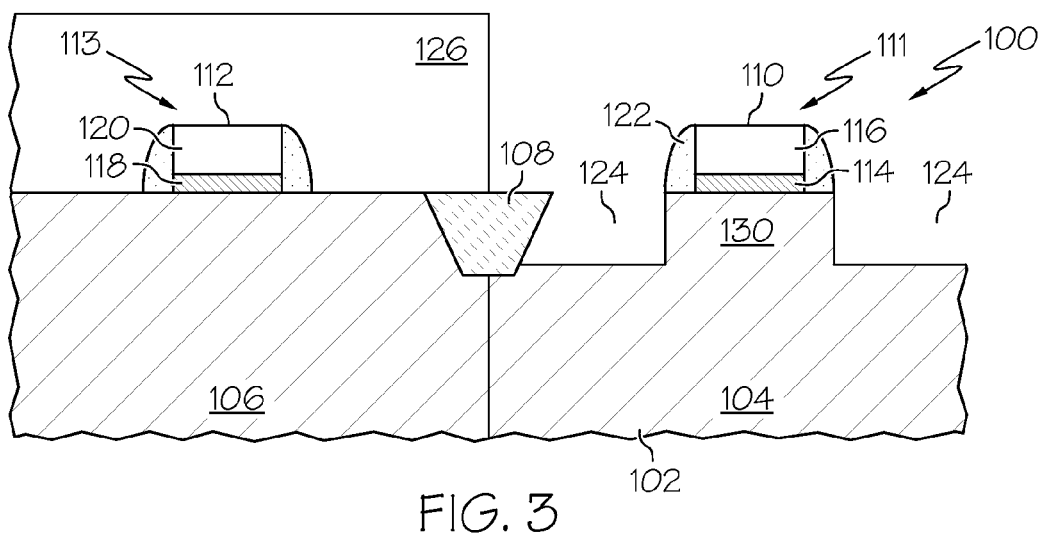

As illustrated in FIG. 3, the fabrication of CMOS IC 100 continues, in accordance with one embodiment, by forming side wall spacers 122 on the side walls of gate electrode structure 110. The side wall spacers can be oxide, nitride, or other insulator, and can be formed by a blanket deposition of a side wall spacer material followed by an anisotropic etch process such as reactive ion etching (RIE). Although illustrated as a single side wall spacer, various process implementations may require one or more separate spacers. In accordance with this embodiment, recesses 124 are etched into PMOS region 104 using gate electrode structure 110 and its associated side wall spacers as etch masks. During the recess etch process NMOS region 106 can be protected from etching by a photolithographically pattered etch mask 126. The photolithographically patterned etch mask can be, for example, a patterned layer of deposited oxide or other insulating material.

Figure 4:
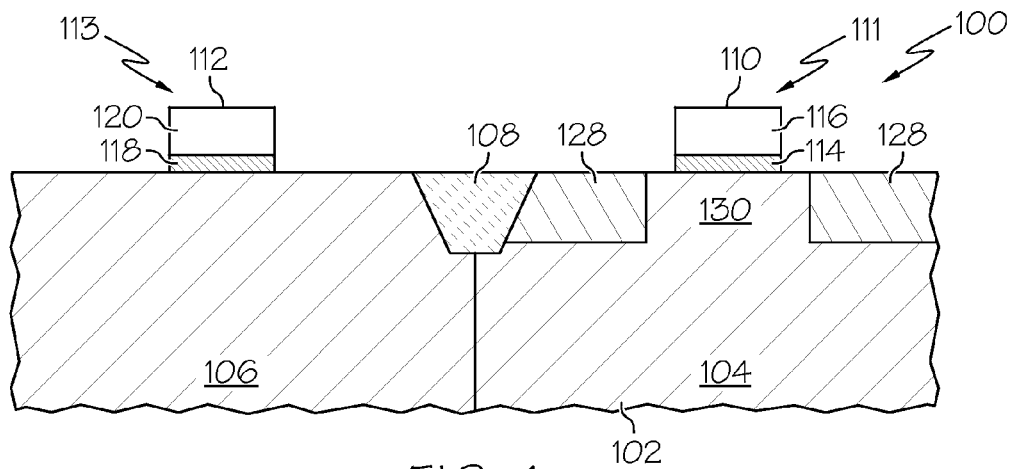

Following the etching of recesses 124 etch mask 126 is removed and the recesses are filled with embedded silicon germanium (eSiGe) 128 as illustrated in FIG. 4. The eSiGe can be grown by a process of selective epitaxial growth as is well known to those of skill in the art. The silicon germanium (SiGe) is aligned with gate electrode structure 110 and the channel region 130 of PMOS transistor 111 underlying the gate electrode structure. Silicon germanium has a larger lattice constant than the host silicon material and hence the eSiGe imparts a lateral compressive stress on the channel region. The lateral compressive stress on the channel of PMOS transistor 111 increases the mobility of majority carrier holes in that channel and thus serves to improve the performance of the transistor. Side wall spacers 122 are removed after the growth of eSiGe 128.

Figure 5:
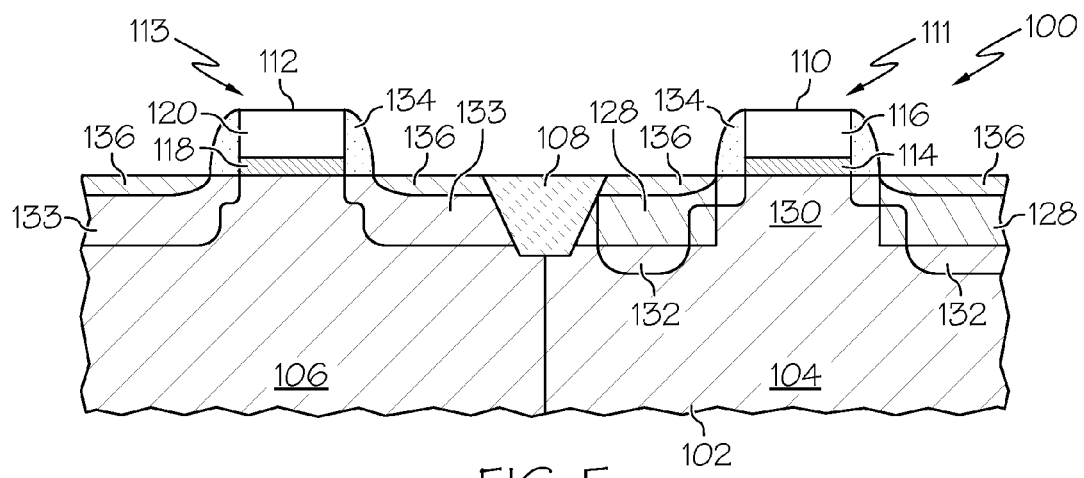

As illustrated in FIG. 5, source and drain regions are formed in alignment with gate electrode structures 110 and 112. The source and drain regions can be formed, for example, by ion implantation. For PMOS transistor 111 source and drain regions 132 can be formed by the implantation of boron ions into PMOS region 104 and into and through eSiGe 128. Similarly, source and drain regions 133 of NMOS transistor 113 can be formed by the implantation of phosphorus or arsenic ions into NMOS region 106. The source and drain regions typically include source and drain extensions formed by ion implantation using the gate electrode structures as implantation masks and deep source and drains formed by additional ion implantations using the gate electrode structures together with side wall spacers 134 as ion implantation masks. As before, side wall spacers can be formed by blanket depositing a layer of side wall spacer forming material and then etching by an anisotropic etch process.

As also illustrated in FIG. 5, following the formation of source and drain regions 132 and 133 nickel silicide (NiSi) contacts 136 are formed at the surface of the source and drain regions. Although referred to herein as "nickel silicide" or "NiSi", it is not intended that those terms be limited to stoichiometric NiSi. Rather, the terms are intended to refer to the metal silicide commonly used in the semiconductor industry and all variations thereof including silicides including nickel as well as other metallic elements. The nickel silicide contacts can be formed, for example, by the sputter deposition of a nickel film followed by a thermal cycle to react the nickel with exposed silicon to form the silicide. The metal silicide contacts are used to reduce the contact resistance between the source and drain regions and subsequently formed metal contacts to those regions.

FIGS. 6-9 illustrate conventional method steps in forming dual stress layers (DSL) on integrated circuit 100. The DSL process is designed to result in a tensile stress layer 138 overlying NMOS transistor 113 and a compressive stress layer 140 overlying PMOS transistor 111. Tensile stress layer 138 enhances the mobility of majority carrier electrons in the channel of the NMOS transistor and compressive stress layer 140 further enhances the mobility of holes in channel 130 of the PMOS transistor.

Figure 6:
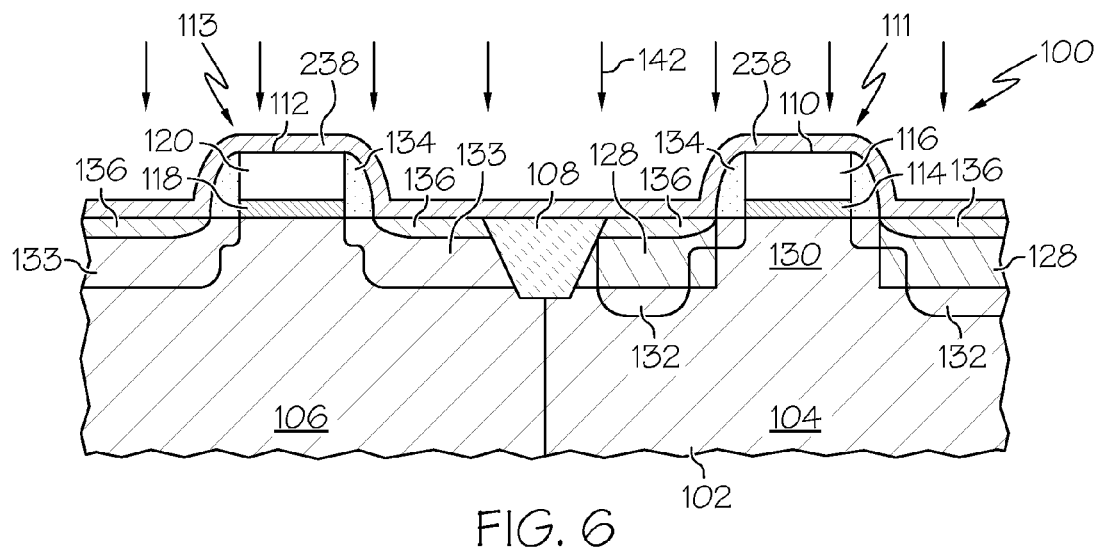

As illustrated in FIG. 6, the conventional DSL process begins by blanket depositing a tensile insulating layer 238 overlying both the PMOS region 104 and the NMOS region 106, including overlying the gate electrode structures and the nickel silicide contacts. The tensile insulating layer can be, for example, a tensile silicon nitride layer deposited by a plasma enhanced chemical vapor deposition (PECVD) process. As is well known, process conditions and reactants are selected to cause the deposited nitride layer to be deposited as a tensile layer. The tensile insulating layer is typically deposited at a temperature between 400° C. and 480° C. Such a tensile silicon nitride layer deposited by a plasma enhanced deposition process may hereinafter be referred to as a "tensile plasma enhanced nitride" (TPEN) layer. In accordance with the conventional process, the tensile insulating layer is cured to drive off excess hydrogen in the film and to increase the tensile stress in the film. The curing step can increase the stress in the layer by up to 50%. The increased stress achieved by this curing step cannot be achieved by deposition conditions alone. The curing step is conventionally done by ultraviolet (uV) radiation as illustrated at 142 to heat the film to between 400° C. and 480° C. Although not illustrated in the FIGURES, an etch stop layer may be deposited before the deposition of tensile insulating layer 238 and a further etch stop layer may be deposited overlying the tensile insulating layer, either before or after the curing step. The etch stop layers facilitate the patterning of both the tensile insulating layer and a subsequently deposited compressive insulating layer.

Figure 7:
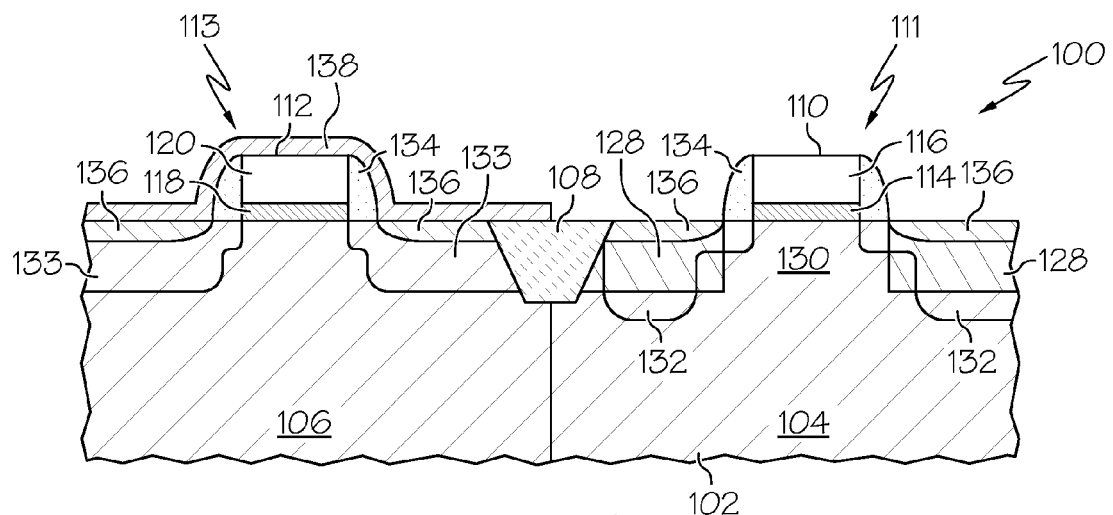

The conventional DSL process continues as illustrated in FIG. 7 by patterning tensile insulating layer 238 to remove the portion of the tensile insulating layer overlying PMOS region 104. The remaining portion of the tensile insulating layer, now indicated by 138, overlies NMOS transistor 113 and NMOS region 106.

Figure 8:
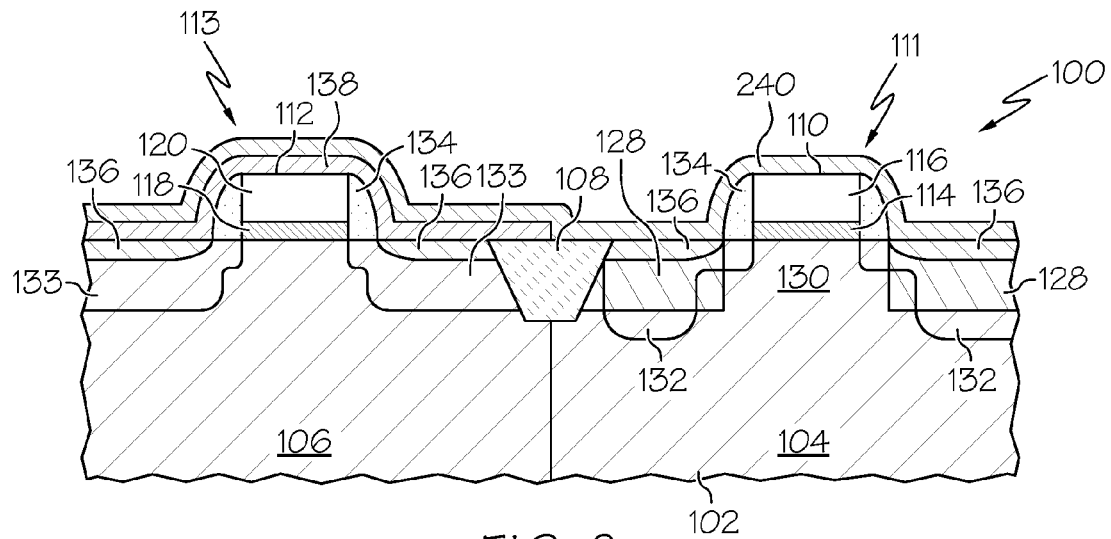

Following the patterning of tensile insulating layer 238 to leave a remaining portion 138 of the tensile insulating layer overlying the NMOS region, a compressive insulating layer 240 is blanket deposited overlying portion 138 of the tensile insulating layer and PMOS region 104 as illustrated in FIG. 8. The compressive insulating material layer can be, for example, a compressive layer of silicon nitride deposited by a PECVD process. Such a compressive silicon nitride layer deposited by a plasma enhanced deposition process may hereinafter be referred to as a "compressive plasma enhanced nitride" (CPEN) layer. As with the deposition of tensile insulating layer 238, the deposition conditions and reactants for depositing compressive insulating layer 240 can be adjusted to deposit a compressive layer.

Figure 9:
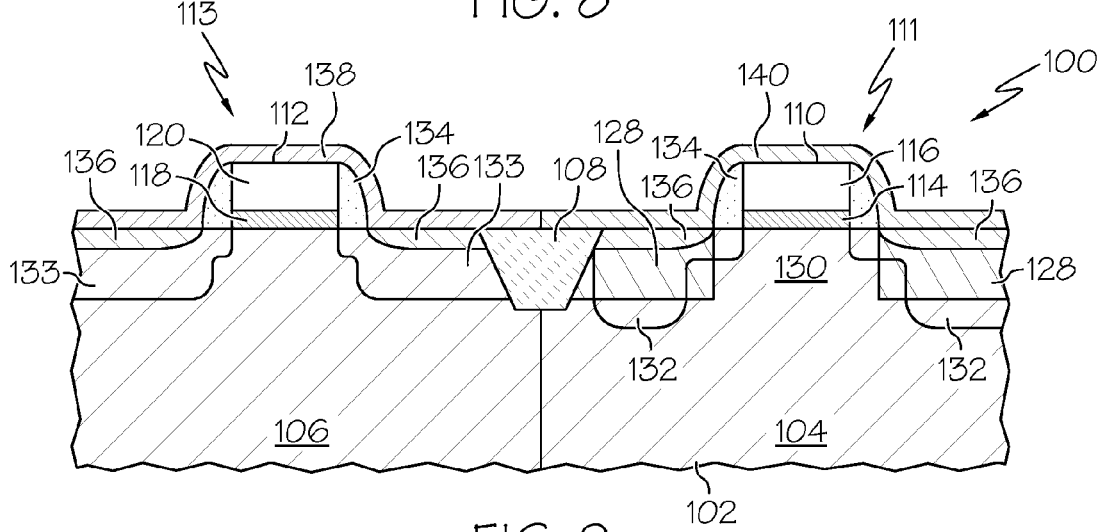

The DSL process, in the conventional process flow, is completed as illustrated in FIG. 9 by removing a portion of the compressive insulating layer 240 overlying the remaining portion of the tensile insulating layer to leave a portion 140 of the compressive insulating layer overlying PMOS transistor 111 and PMOS region 104. Analysis of the integrated circuit structure at this point in the fabrication process shows a significant morphological degradation of the nickel silicide contacts in the PMOS region which results in a large number of voids in the nickel silicide contacts. The voids can be of such large dimension that subsequently formed metallization extends partially or even completely through the silicide contact to the underlying impurity doped source and drain regions. Metallization extending even partially through the silicide contacts results in high Ohmic contact resistance or even open circuits to the affected source and drain regions. If processing of the integrated circuit is continued, the voids in the nickel silicide contacts lead to a large percentage of device failures.

The inventors have discovered that the morphological change and voids in the nickel silicide contacts results from the combination of the high temperature of the uV cure cycle of the tensile insulating layer, the stress associated with the tensile insulating layer overlying the NiSi contacts, and the presence of germanium in the embedded SiGe regions. During the formation of the nickel silicide contacts germanium from the eSiGe is incorporated in the silicide, so the silicide formed on the source and drain regions of the PMOS transistors is not as homogeneous as is the silicide formed on the source and drain regions of the NMOS transistors. The tensile stress layer 238 is in direct contact with the non-homogeneous NiSi contacts during the uV cure heat cycle and it is the stress from the tensile stress layer on the non-homogeneous NiSi contacts in combination with the high temperature that results in the formation of voids. The incidence of voids in the nickel silicide contacts can be reduced by lowering either or both of the tensile insulating layer deposition and curing temperatures, although even doing the deposition and curing at 400° C. does not significantly reduce the problem.

Figure 10:
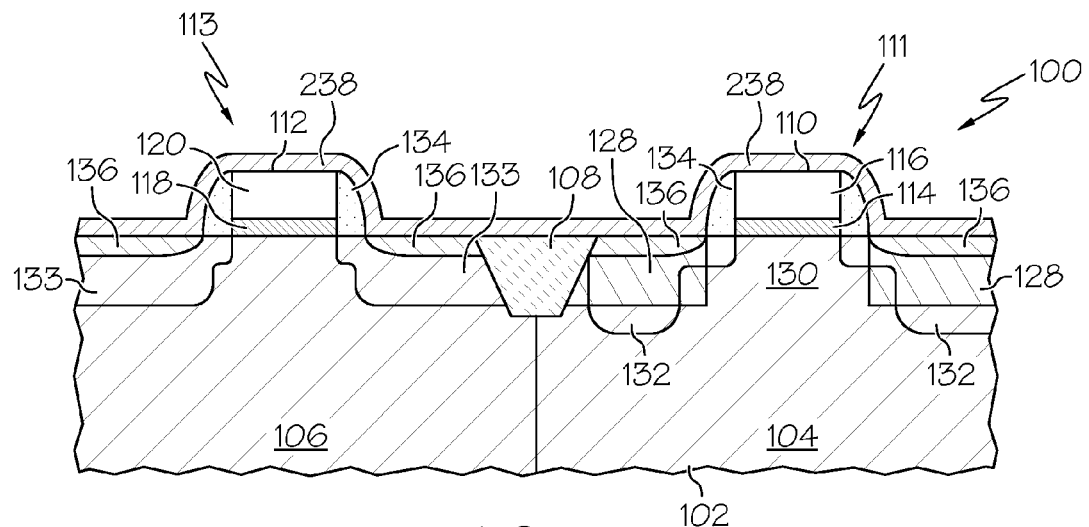

FIGS. 10-13 together with FIGS. 1-5 illustrate methods for fabricating a CMOS integrated circuit 100 having a dual stress layer without significant holes in nickel silicide contacts in accordance with various embodiments of the present teaching. Methods in accordance with those embodiments begin with the same steps illustrated in FIGS. 1-5. Following the formation of nickel silicide contacts 136, a tensile insulating layer 238 is blanket deposited overlying both the PMOS region 104 and the NMOS region 106, including overlying the gate electrode structures and the NiSi contacts as illustrated in FIG. 10. As described above, the tensile insulating layer can be a TPEN layer. The tensile insulating layer can be deposited, for example, at a temperature between 400° C. and 480° C. and preferably at a temperature of about 400° C.

Figure 11:
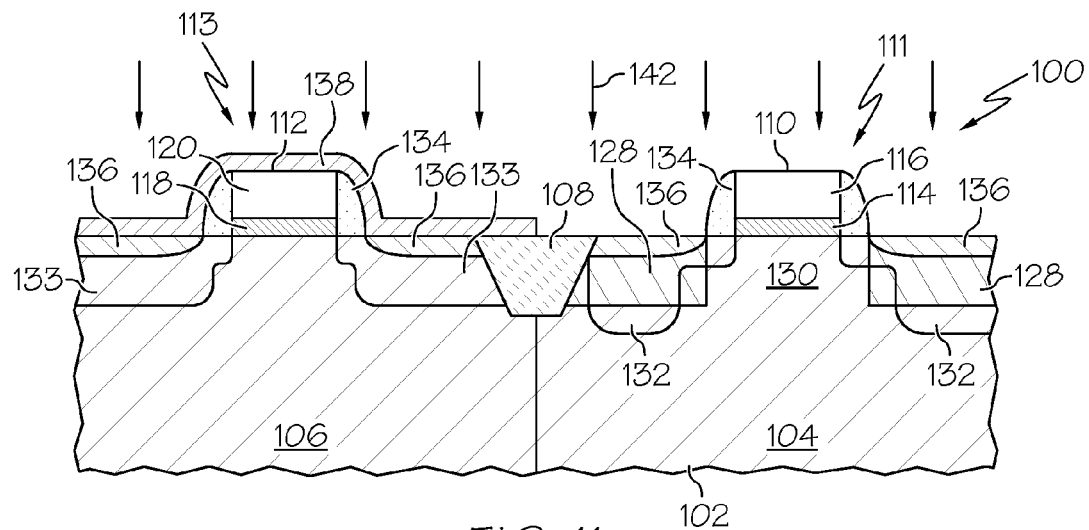

In accordance with this embodiment, however, tensile insulating layer 238 is patterned as illustrated in FIG. 11 before being cured to remove excess hydrogen. Tensile insulating layer 238 is patterned to remove a portion of the layer overlying PMOS region 104 and to leave a remaining portion 138 overlying NMOS region 106. As illustrated by arrows 142, the remaining tensile insulating layer 138 is then cured, for example by uV radiation to raise the temperature of the remaining tensile insulating layer to a temperature between 400° C. and 480° C. and preferably to a temperature of about 400° C. The tensile insulating layer 238 is removed from the nickel silicide contacts formed in PMOS region 104 including nickel silicide contacts formed overlying eSiGe regions before the curing step, thus avoiding the combination of factors that caused the formation of voids in the nickel silicide contacts in the conventional process. As explained above, tensile insulating layer 138 overlying gate electrode structure 112 serves to enhance the mobility of majority carrier electrons in the channel of NMOS transistor 113. The uV cure step serves to increase the stress in the tensile insulating layer.

Figure 12:
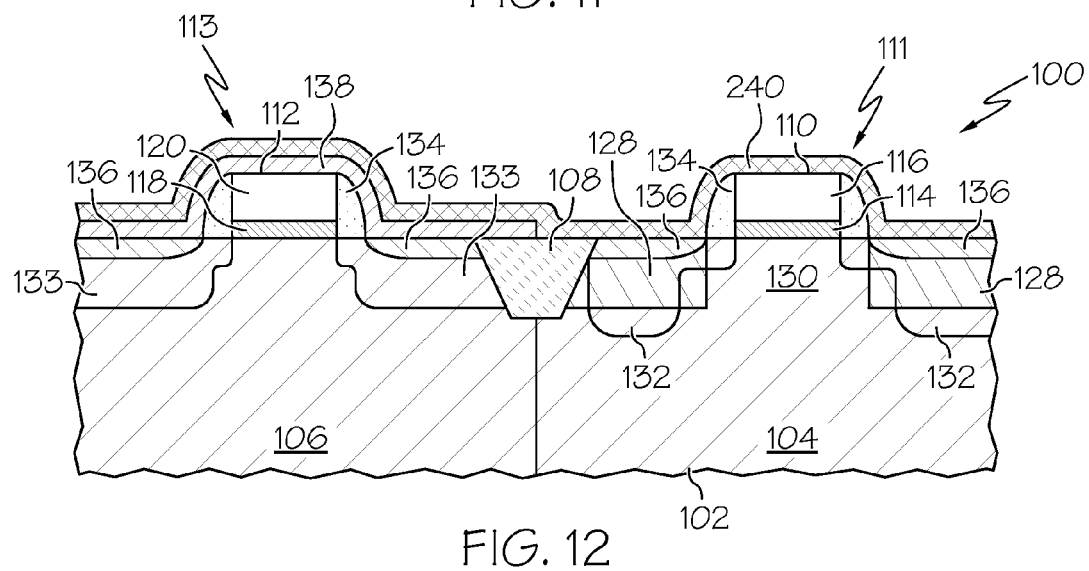

The method for fabricating an integrated circuit 100 having a dual stress layer without voids in the nickel silicide contacts continues as illustrated in FIG. 12 by the blanket deposition of a compressive insulating layer 240 overlying both PMOS region 104 and NMOS region 106 including overlying tensile insulating layer 138. Compressive insulating layer 240 can be, for example, a CPEN layer deposited at a temperature between about 400° C. and about 480° C. As explained above, the presence of a compressive insulating layer overlying PMOS region 104 and gate electrode structure 110 serves to enhance the mobility of majority carrier holes in channel 130 of PMOS transistor 111.

The dual stress layer process, in accordance with one embodiment of the present teaching, is completed, as illustrated in FIG. 13 by removing a portion of compressive insulating layer 240 overlying NMOS region 106 and tensile insulating layer 138. A remaining portion 140 of the compressive insulating layer overlies PMOS region 104 and gate electrode structure 110. After the patterning of the compressive insulating layer, the fabrication of CMOS integrated circuit is completed in the conventional manner. For example, although not shown, an insulating layer is blanket deposited overlying the tensile and compressive insulating layers, openings are etched through that insulating layer to expose portions of the nickel silicide contacts, and interconnect metallization is deposited to fill those opening and to make electrical contact to the nickel silicide on the source and drain regions.

FIGS. 14 and 15 illustrate, in flow chart form, the differences between the conventional process for forming dual stress layers on a CMOS integrated circuit and the present process for forming dual stress layers without forming voids in underlying nickel silicide layers in accordance with embodiments of the improved method. The flow chart in FIG. 14 illustrates conventional process 300 and the flow chart in FIG. 15 illustrates embodiments of improved process 400.

As illustrated in FIG. 14, conventional process 300 begins at step 302 by the deposition of a tensile insulating layer (for example, TPEN) overlying both the NMOS region and the PMOS region of the semiconductor substrate followed at step 304 by curing that layer, for example by uV radiation. The tensile insulating layer is patterned at step 306 to remove the portion of the tensile insulating layer that overlies the PMOS region. At step 308 a compressive insulating layer (for example, CPEN) is deposited overlying the PMOS region and the remaining portion of the tensile insulating layer. A portion of the compressive insulating layer overlying the NMOS region and the tensile insulating layer is removed at step 310 to complete the conventional DSL process.

In contrast, embodiments of the present, improved DSL process 400, as part of the disclosed methods for fabricating a CMOS integrated circuit, are illustrated in FIG. 15. Embodiments of process 400 begin at step 402 by the deposition of a tensile insulating layer (for example, TPEN) overlying both the NMOS region and the PMOS region of the semiconductor substrate. A portion of the tensile insulating layer overlying the PMOS region is removed at step 404 before heating that layer in a cure step. After removing the tensile insulating layer overlying the PMOS region the remaining portion of the tensile insulating layer is cured at step 406 to remove excess hydrogen and to increase the stress in the layer, for example by heating with uV radiation. At step 408 a compressive insulating layer (for example, CPEN) is deposited overlying the PMOS region and the remaining portion of the tensile insulating layer. A portion of the compressive insulating layer overlying the NMOS region and the tensile insulating layer is removed at step 410 to complete the present, improved DSL process. No addition process steps or process complexity is required by the present improved embodiment in comparison to the conventional process.

Figure 16:
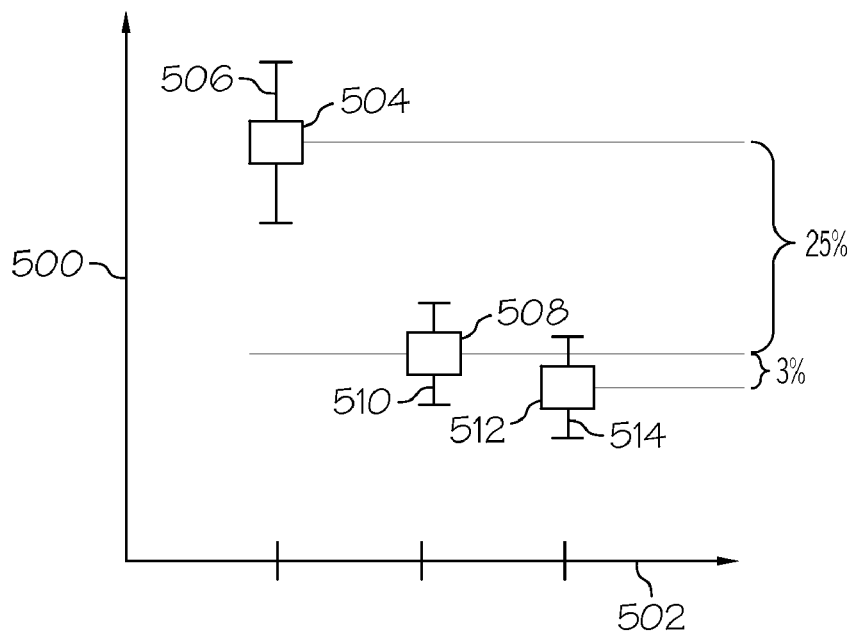
FIG. 16 illustrates, in graphical form, the improvement in contact resistance to be realized in the fabrication of an integrated circuit using the present teaching in contrast to the conventional process.
Figure 17:
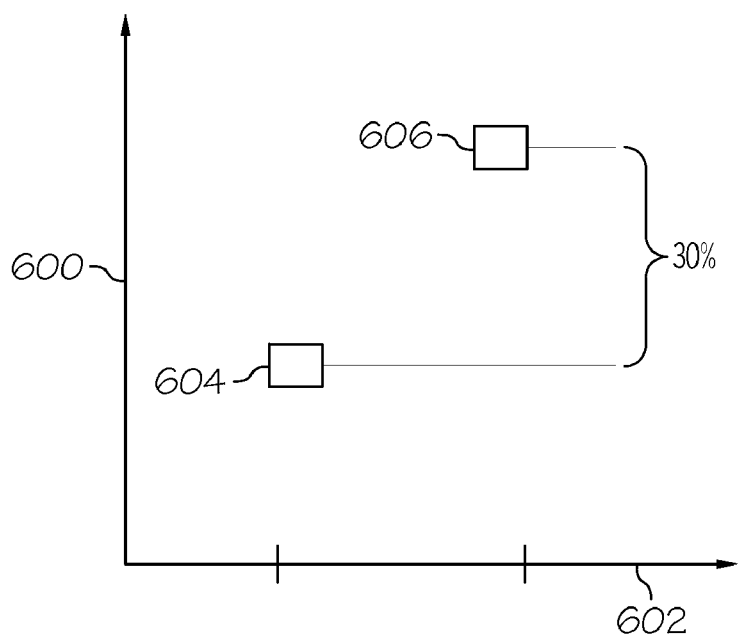
FIG. 17 illustrates, in graphical form, the improvement in yield to be realized in the fabrication of an integrated circuit using the present teaching in contrast to the conventional process.

FIGS. 16 and 17 illustrate graphically the benefits achieved by embodiments of the present improved methods for fabricating a CMOS IC in contrast to the conventional process. Dual stress layers overlying nickel silicide test structures were processed in accordance with the conventional process illustrated in FIGS. 6-9 and in accordance with the improved present teaching. FIG. 16 shows the resistance, as measured by a 4 point probe measurement, of nickel silicide samples plotted along y-axis 500. Various process embodiments are spaced along x-axis 502. The mean resistance of nickel silicide samples processed in accordance with the conventional method is indicated at point 504. The variation in measured resistance values is indicated by error bars 506. The tensile insulating layers deposited in accordance with this embodiment were deposited at a temperature of 400° C. The mean resistance of nickel silicide samples processed in accordance with one embodiment of the present method is indicated at point 508 and the variation in measured resistance values is indicated by error bars 510. The tensile insulating layer deposited in accordance with this embodiment was deposited at a temperature of 480° C. Even though the tensile insulating layer was deposited at a higher temperature (480° C. vs. 400° C.), a decrease in the measured mean resistance value of 25% was observed and a marked decrease in the variation of measured resistance values was also observed. The mean resistance of nickel silicide samples process in accordance with a further embodiment of the present method is indicated at point 512 and the variation in measured resistance values is indicated by error bars 514. The tensile insulating layer deposited in accordance with this embodiment was deposited at a temperature of 400° C. A further decrease in the measured mean resistance value of 3% was observed and a still further decrease in the variation of measured resistance values was also observed.

FIG. 17 illustrates graphically the improved yield achieved by embodiments of the present improved methods for fabricating a CMOS IC in contrast to the conventional process. Functional yield is plotted along y-axis 600 and process embodiments are spaced along x-axis 602. The functional yield of a lot processed in accordance with the conventional process is indicated at 604. In contrast, the functional yield of a lot processed in accordance with an embodiment of the present, improved method is indicated at 606. A 30% improvement in yield is observed for the lot processed in accordance with an embodiment of the present, improved method.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A method for fabricating a CMOS integrated circuit comprising:
    epitaxially growing embedded silicon germanium in regions of a semiconductor substrate;
    forming SiGe-stressed source and drain regions in the embedded silicon germanium;
    forming non-SiGe-stressed source and drain regions in the semiconductor substrate;
    forming nickel silicide contacts in the SiGe-stressed source and drain regions and in the non-SiGe-stressed source and drain regions;
    depositing a tensile insulating layer overlying the nickel silicide contacts by a first process of plasma enhanced deposition prior to depositing a compressive insulating layer;
    removing a portion of the tensile insulating layer overlying the SiGe-stressed source and drain regions, leaving a remaining portion of the tensile insulating layer overlying all of the non-SiGe-stressed source and drain regions and thereafter curing the remaining portion;
    depositing the compressive insulating layer overlying the SiGe-stressed source and drain regions and the remaining portion of the tensile insulating layer by a second process of plasma enhanced deposition after curing the remaining portion of the tensile insulating layer; and removing a portion of the compressive insulating layer overlying the remaining portion of the tensile insulating layer.

2. The method of claim 1 further comprising:

forming first gate electrode structures and second gate electrode structures on the semiconductor substrate.

3. The method of claim 2, wherein epitaxially growing the embedded silicon germanium comprises:

epitaxially growing the embedded silicon germanium around and in alignment with the first gate electrode structures.

4. The method of claim 2 further comprising:

implanting conductivity determining ions into the embedded silicon germanium to form the SiGe-stressed source and drain regions in alignment with the first gate electrode structures and implanting conductivity determining ions into the semiconductor substrate to form the non-SiGe-stressed source and drain regions in alignment with the second gate electrode structures.

5. The method of claim 1 wherein curing the remaining portion comprises exposing the remaining portion to ultraviolet radiation.

6. The method of claim 5 wherein exposing the remaining portion to ultraviolet radiation comprises exposing the remaining portion to ultraviolet radiation to raise the remaining portion to a temperature of about 400° C.

7. The method of claim 6 wherein depositing a tensile insulating layer comprises depositing a silicon nitride layer by a process of plasma enhanced deposition at a temperature of about 400° C.

8. A method for fabricating a CMOS integrated circuit comprising:

forming first gate structures and second gate structures on a semiconductor substrate;

epitaxially growing embedded SiGe in portions of the semiconductor substrate around and in alignment with the first gate structures;

forming SiGe-stressed source and drain regions in the embedded SiGe around the first gate structures and non-stressed source and drain regions around the second gate structures;

forming nickel silicide contacts in the SiGe-stressed source and drain regions and in the non-stressed source and drain regions;

depositing a tensile nitride layer overlying the nickel silicide contacts in the SiGe-stressed source and drain regions and in the non-stressed source and drain regions by a first process of plasma enhanced chemical vapor deposition prior to depositing a compressive nitride layer;

removing a portion of the tensile nitride layer overlying the SiGe-stressed source and drain regions and thereafter curing the tensile nitride layer overlying all of the nickel silicide contacts in the non-stressed source and drain regions with ultraviolet radiation; and depositing the compressive nitride layer overlying the SiGe-stressed source and drain regions by a second process of plasma enhanced chemical vapor deposition after curing the tensile nitride layer.

9. The method of claim 8 wherein curing the tensile nitride layer comprises curing the nitride layer at a temperature of about 400° C.

10. The method of claim 9 wherein depositing a tensile nitride layer comprises depositing the tensile nitride layer at a temperature of about 400° C.

11. The method of claim 8 further comprising removing a portion of the compressive nitride layer overlying the non-stressed source and drain regions.

12. A method for fabricating a CMOS integrated circuit comprising:

depositing a tensile stress layer overlying a semiconductor substrate including SiGe-stressed source and drain regions and non-stressed source and drain regions by a first process of plasma enhanced deposition prior to depositing a compressive stress layer overlying the semiconductor substrate, wherein nickel silicide contacts are formed overlying the SiGe-stressed source and drain regions and the non-stressed source and drain regions;

removing the tensile stress layer overlying the SiGe-stressed source and drain regions and leaving a remaining portion of the tensile stress layer covering the non-stressed source and drain regions before applying a curing radiation;

applying a curing radiation to the remaining portion; and depositing the compressive stress layer overlying the semiconductor substrate and the remaining portion by a second process of plasma enhanced deposition after applying the curing radiation.

13. The method of claim 12 wherein applying a curing radiation comprises ultraviolet irradiating the remaining portion to a temperature of about 400° C.

14. The method of claim 13 wherein depositing a tensile stress layer comprises depositing a tensile nitride layer at a temperature of about 400° C.

* * * * *